(12) United States Patent
Yudasaka et al.

(10) Patent No.: US 6,767,775 B1
(45) Date of Patent: Jul. 27, 2004

(54) METHOD OF MANUFACTURING THIN-FILM TRANSISTOR

(75) Inventors: Ichio Yudasaka, Chimo (JP); Tatsuya Shimoda, Nagano-ken (JP); Shunichi Seki, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/701,648

(22) PCT Filed: Mar. 29, 2000

(86) PCT No.: PCT/JP00/01986

§ 371 (c)(1),
(2), (4) Date: Nov. 30, 2000

(87) PCT Pub. No.: WO00/59041

PCT Pub. Date: Oct. 5, 2000

(30) Foreign Application Priority Data

Mar. 30, 1999 (JP) .......................................... 11-127502

(51) Int. Cl.[7] .......................... H01L 21/00; H01L 21/84
(52) U.S. Cl. ...................................................... 438/156
(58) Field of Search ................................. 438/150, 151, 438/149, 161, 162, 163, 164, 166, 142, 156; 427/226; 430/272

(56) References Cited

U.S. PATENT DOCUMENTS

| | | | | |
|---|---|---|---|---|
| 4,332,879 A | * | 6/1982 | Pastor et al. ................. | 430/272 |
| 4,683,147 A | * | 7/1987 | Eguchi et al. ............... | 427/583 |
| 4,719,125 A | * | 1/1988 | Anello et al. ................ | 437/231 |
| 4,724,219 A | * | 2/1988 | Ridinger ....................... | 437/19 |
| 5,294,425 A | * | 3/1994 | Schwab ........................ | 423/324 |
| 5,358,739 A | * | 10/1994 | Baney et al. ................ | 427/226 |
| 5,500,537 A | | 3/1996 | Tsumura et al. | |
| 5,747,381 A | * | 5/1998 | Wu et al. ..................... | 438/624 |
| 5,770,260 A | * | 6/1998 | Fukuyama et al. ......... | 427/226 |
| 5,866,471 A | | 2/1999 | Beppu et al. ................ | 438/502 |
| 5,912,047 A | * | 6/1999 | Chandra et al. ............. | 427/226 |
| 5,922,411 A | * | 7/1999 | Shimizu et al. ........... | 427/397.7 |
| 5,980,699 A | * | 11/1999 | Timmons et al. ........ | 204/157.4 |
| 5,989,945 A | * | 11/1999 | Yudasaka et al. ........... | 438/149 |
| 6,071,796 A | * | 6/2000 | Voutsas ....................... | 438/487 |
| 6,310,168 B1 | * | 10/2001 | Shimizu et al. .............. | 528/28 |
| 6,383,641 B1 | * | 5/2002 | Kondou et al. ............. | 428/412 |
| 2001/0021760 A1 | * | 9/2001 | Matsuki et al. ............... | 528/10 |

FOREIGN PATENT DOCUMENTS

| | | |
|---|---|---|
| CN | 1194697 A | 9/1998 |
| JP | 4-81820 | 3/1992 |
| JP | 5-144741 | 6/1993 |
| JP | 09-45922 A | 2/1997 |
| JP | 9-45922 | 2/1997 |
| JP | 10-161140 | 6/1998 |
| JP | 11-8395 | 1/1999 |

* cited by examiner

*Primary Examiner*—Richard Elms
*Assistant Examiner*—Christian D. Wilson
(74) *Attorney, Agent, or Firm*—Oliff & Berridge, PLC

(57) ABSTRACT

All or a part of the thin films such as the silicon film, insulation film and conductive film are formed using liquid materials. The main method includes the steps of forming a coating film by coating the liquid material on the substrate, and heat-treating the coating film for converting it into a desired thin film, thereby enabling the thin film transistor to be manufactured using a cheap manufacturing equipment.

42 Claims, 5 Drawing Sheets

(a)

(b)

(a)

(b)

(c)

(d)

(e)

METHOD OF MANUFACTURING THIN-FILM TRANSISTOR

BACKGROUND OF THE INVENTION

1. Field of the Invention

The present invention relates to a method for manufacturing thin film transistor to be used for liquid crystal display devices, luminescent display devices and LSIs. In more detail, the present invention relates to a method for manufacturing a thin film transistor by forming a thin film constituting the thin film transistor using a liquid material.

2. Description of the Art

A thin film transistor is usually composed of thin films, such as semiconductor films, insulation films and conductive films. When these thin films are categorized depending on their functions, the insulation film includes gate insulation films and interlayer insulation films, and the conductive film is used for gate electrodes, source/drain electrodes, pixel electrodes and wiring lines. These thin films have been mainly deposited by a CVD (Chemical Vapor Deposition) method and a sputtering method.

Silicon films, such as amorphous silicon films, and polysilicone films have been mainly used for the semiconductor films. The silicon films have been usually formed by a thermal CVD method, a plasma CVD method or a photo-CVD method using monosilane gas or disilane gas. The thermal CVD method has been generally used for depositing the poly-silicon film (J. Vac. Sci. Technology, vol. 14, p1082 (1977)), while the plasma CVD method has been widely used for depositing the amorphous silicon (Solid State Com., vol. 17, p1193 (1975)).

However, the silicon film formed by the CVD method have involved some problems which need to be improved in the manufacturing process: (1) manufacturing yield is low due to contamination of the manufacturing apparatus and generation of foreign substances, since silicon particles appear in the gas phase to be used for the gas phase reaction, (2) a silicon film with a uniform thickness can not be deposited on a substrate having a rough surface, since a gaseous starting material is used, (3) a step for heating the substrate is required, and productivity is low due to a slow deposition rate of the film, and (4) a complicated and expensive microwave generator and an evacuation apparatus are necessary in the plasma CVD method.

Handling of highly reactive gaseous silicon hydride to be used as a starting material is difficult, in addition to requiring an air-tight evacuation apparatus as well as a pollutant elimination apparatus for the treatment of exhaust gases. Not only is such a large scale facility itself expensive, but also a large amount of energy is consumed in the vacuum system and plasma system, rendering the product a high manufacturing cost.

A method for coating liquid silicon hydride that is free from the vacuum system has been proposed in recent years. Japanese Unexamined Patent Application Publication No. 1-29661 discloses a method for forming a silicon thin film by allowing a gaseous material to be liquefied and absorbed on a chilled substrate as a liquid, followed by allowing the substrate to react with chemically active atomic hydrogen. However, the method also involves a problem that a complicated apparatus is required for continuously evaporating and liquefying silicon hydride, and control of the film thickness is difficult.

While Japanese Unexamined Patent Application Publication No. 7-267621 discloses a method for coating the substrate with low molecular weight liquid silicon hydride, on the other hand, handling of this complex system is so troublesome that it is difficult to obtain a uniform film thickness when applied to a large area substrate.

While an example of a solid silicon hydride polymer has been reported in UK Patent GB-2077710A, it is impossible to form a film by coating since the compound is insoluble in solvents.

The silicon semiconductor film as described above is usually used as a positive or negative type semiconductor by doping Group III elements or Group V elements in the periodic table. These elements are usually doped by heat diffusion or an ion-injection method after forming the silicon film. Since the heat diffusion method is in principle a high-temperature process (requiring a temperature as high as more than 800° C.), the material available as the substrate is limited. In particular, a glass substrate used for liquid crystal devices is not suitable for the high temperature process. Although the ion-injection method has a feature that impurity distribution toward the depth of the silicon film can be controlled, on the other hand, it is a problem that an evacuation apparatus is necessary besides the apparatus is large in size and heavy as well as expansive.

A dope silicon film in which impurities are doped has been also formed by the CVD method that is used for forming conventional non-dope silicon films. However, this method for forming the dope silicon film involves all the features and problems in the CVD method.

The hot CVD method and plasma CVD method as used in forming the silicon film are also used in forming insulation films such as a gate insulation film and an interlayer insulation film to be used in the thin film transistor. While the insulation film and organic insulation film formed of SOG are frequently used for the purpose of planarization, they are seldom used alone but are used together with the film formed by the CVD method.

The sputtering method is widely used for forming a gate electrode to be used for the thin film transistor, conductive films for the electrode such as source/drain electrodes, a conductive film for wiring lines, and a transparent conductive film to be used for pixel electrodes.

The CVD method involves the following four features, which are the same as those in forming the silicon film as an insulation film: (1) manufacturing yield is low due to contamination of the manufacturing apparatus and generation of foreign substances, since silicon particles appear in the gas phase to be used for the gas phase reaction, (2) a silicon film with a uniform thickness can not be deposited on a substrate having a rough surface, since a gaseous starting material is used, (3) a step for heating the substrate is required, and productivity is low due to a slow deposition rate of the film, and (4) a complicated and expensive microwave generator and an evacuation apparatus are necessary in the plasma CVD method.

An evacuation apparatus, in addition to a vacuum pump as well as a target material, a sputtering power source and a substrate heating apparatus, are required for the sputtering method to be utilized in forming the conductive film which mainly includes a metal film and the transparent conductive film. Although a toxic and combustible gas is seldom used in the sputtering method as compared with the CVD method, the film is deposited not only on the substrate as a film deposition object, but also on the inner wall of the chamber in which the substrate is placed. Peeled pieces of the deposition material from the inner wall serve as foreign substances during the film deposition process to result in decreased manufacturing yield of the product as in the CVD method. It is the common drawbacks of the sputtering method with the CVD method that the film thickness is uneven at the rough portions on the surface of the substrate, productivity is low, and the facilities become large scale and expensive because an evacuation apparatus is required.

Accordingly, the method for forming the thin film by the conventional CVD method and sputtering method have involved the common problems of low productivity, high incidence of film defects and low yield, uneven film thickness at the rough surface portions, and breakage of wiring patterns at the steps. These problems also cause increased manufacturing cost of the thin film transistor. These problems in the CVD method and sputtering method arise from intrinsic features of the film deposition method such as use of the evacuation apparatus, need of heating of the substrate, requirement of a power source for plasma generation, and film deposition on unnecessary portions such as the inner wall of the apparatus other than the substrate. These intrinsic features arise other problems that the large scale apparatus leads to a high facility cost, and the running cost of the apparatus is also high.

In the conventional method for injecting impurities into the silicon film, the CVD method involves the same problem as described above, while the ion injection method involves the problems of expansive apparatus and high running cost. These problems result in high cost of the thin film transistor manufactured by the conventional method.

SUMMARY OF THE INVENTION

The present invention proposes a method for manufacturing a thin film transistor by a novel method essentially different from the conventional film deposition method. The object of the present invention is to solve the intrinsic problems in the conventional film deposition method, enabling the thin film to be formed with high productivity, small incidence of film defects, high manufacturing yield, no breakage of wiring lines at the steps, and low manufacturing cost using a small size and cheap apparatus, thereby manufacturing the thin film transistor with an extremely lower cost than the conventional ones.

All or a part of the thin films such as the silicon film, insulation film and conductive film constituting the thin film transistor are formed using a liquid material in the present invention for solving the foregoing problems. Introduction of impurities and control of the amount of the impurities required for manufacturing the thin film transistor are realized by forming the thin film of silicon using liquid materials. The method for forming the thin film using the liquid materials mainly comprises the steps of forming a coating film by coating a substrate with the liquid material, and forming a desired thin film by heat-treating the coating film.

In a first aspect, the present invention provides a method for manufacturing a thin film transistor comprising each thin film of a silicon film in which the impurity concentration has been controlled, an insulation film and a conductive film, the silicon film in which the impurity concentration has been controlled comprising a non-dope silicon film and a dope silicon film, wherein the non-dope silicon film is formed by the steps comprising forming a coating film by coating a substrate with a liquid material containing silicon atoms, and heat-treating the coating film for converting it into the non-dope silicon film, and wherein the dope silicon film is formed by the steps comprising forming a coating film by coating the substrate with a liquid material containing the silicon atoms and boron or phosphorous, and heat-treating the coating film for converting it into the dope silicon film.

Preferably, the non-dope silicon film forms a channel region and the dope silicon film forms source/drain regions. The dope silicon film also forms electrodes and wiring lines.

In a second aspect, the present invention provides a method for manufacturing a thin film transistor comprising each thin film of a silicon film in which the concentration of impurities has been controlled, an insulation film and a conductive film, for obtaining the silicon film in which the concentration of the impurities including the concentration of desired impurities has been controlled, comprising the steps of forming a coating film by coating the substrate with a mixed solution of a liquid material containing silicon atoms and a liquid material containing the silicon atoms and impurities, and heat-treating the coating film to convert it into the silicon film in which the concentration of the impurities has been controlled.

The silicon film in which the concentration of the impurities including the concentration of desired impurities has been controlled may form a channel region.

In a third aspect, the present invention provides a method for manufacturing a thin film transistor comprising each thin film of a silicon film in which the concentration of impurities has been controlled, an insulation film and a conductive film, the silicon film in which the concentration of the impurities has been controlled comprising a laminated film of a non-dope silicon film and dope silicon film, wherein the non-dope silicon film is formed by the steps of forming a coating film by coating the substrate with a liquid material containing silicon atoms, and heat-treating the coating film for converting it into the non-dope silicon film, and wherein the dope silicon film is formed by the steps comprising forming a coating film by coating the substrate with a liquid material containing the silicon atoms and impurities, and heat-treating the coating film for converting it into the dope silicon film.

Preferably, the silicon film comprising a laminated film of the non-dope silicon film and dope silicon film forms a channel region.

In a fourth aspect, the present invention provides a method for manufacturing a thin film transistor comprising each thin film of a silicon film in which the concentration of impurities has been controlled, an insulation film and a conductive film, comprising the steps of: forming a coating film by coating a liquid material containing silicon atoms or a liquid material containing silicon atoms and impurities on an insulation substrate or an insulation film; heat treating the coating film to convert it into the silicon film in which the concentration of the impurities has been controlled; forming an islet region that serves as a source, drain and channel by patterning the silicon film; forming a gate insulation film; forming a gate electrode; exposing the silicon film that serves as source/drain regions by removing the gate insulation film on the source/drain regions using the gate electrode as a mask; forming a coating film by coating the liquid material containing the silicon atoms and impurities on the exposed source/drain regions; applying a first heat-treatment for forming a dope silicon film by heat-treating the coating film; applying a second heat-treatment for diffusing the impurities in the dope silicon film into the silicon film as a lower layer; forming a pattern overlapping a part of the source/drain regions by patterning the dope silicon film; forming an interlayer insulation film; opening contact holes on the interlayer insulation film; and forming electrodes.

In a fifth aspect, the present invention provides a method for manufacturing a thin film transistor comprising each thin film of a silicon film in which the concentration of impurities has been controlled, an insulation film and a conductive film, comprising the steps of: forming a coating film by coating a liquid material containing silicon atoms and impurities on an insulation substrate or insulation film; forming source/drain regions by heat-treating the coating film to convert it into the dope silicon film; forming a coating film by coating a liquid material containing silicon atoms or a liquid material containing silicon atoms and impurities on the substrate; heat-treating the coating film for converting it into the silicon film in which the concentration of the impurities has been controlled; forming an islet region containing the channel region for connecting to the source/drain regions by patterning the silicon film in which the concentration of the impurities has been controlled; forming a gate insulation film; forming a gate electrode; forming an interlayer insulation film; opening contact holes on the interlayer insulation film; and forming electrodes.

In a sixth aspect, the present invention provides a method for manufacturing a thin film transistor comprising each thin film of a silicon film in which the concentration of impurities has been controlled, an insulation film and a conductive film, comprising the steps of: forming a gate electrode on the insulation substrate or insulation film; forming a gate insulation film; forming a coating film by coating a liquid material containing silicon atoms or a liquid material containing silicon atoms and impurities on the substrate; heat-treating the coating film for converting it into the silicon film in which the concentration of the impurities has been controlled; forming a coating film by coating a liquid material containing silicon atoms and impurities; forming source/drain regions as silicon films doped with impurities by heat-treating the coating film; and forming electrodes.

In accordance with the first to sixth aspects, the present invention provides a method for manufacturing a thin film transistor, wherein the heat-treatment step comprising forming the coating film by coating the liquid material on the substrate, followed by forming the silicon film in which the concentration of the impurities has been controlled by heat treating the coating film, comprises a first heat-treatment step for removing a solvent from the coating film, and a second heat-treatment step for forming the silicon film in which the concentration of the impurities has been controlled.

In accordance with the first to sixth, aspects the present invention provides a method for manufacturing a thin film transistor, wherein the heat-treatment step comprising forming the coating film by coating the liquid material on the substrate, followed by forming the silicon film in which the concentration of the impurities has been controlled by heat treating the coating film, comprises a first heat-treatment step for removing a solvent from the coating film, a second heat-treatment step for forming the silicon film in which the concentration of the impurities has been controlled, and a third heat-treatment step for crystallizing the silicon film in which the concentration of the impurities has been controlled.

In the present invention so configured as described above, the first heat-treatment step preferably comprises a drying step for removing the solvent, and a heat-decomposition and/or photo-decomposition step in the coating film. The photo-decomposition step preferably comprises irradiating a light with a wavelength of more than 170 nm and less than 380 nm to the coating film. In a preferable embodiment, the second and third heat-treatment steps comprises a heat-treatment by lamp annealing or laser annealing. In an another preferable embodiment, the first, second and third heat-treatment steps comprises treating the silicon film in an atmosphere in which the oxygen concentration is controlled so that the concentration of oxygen contained in the silicon film, which is formed via the heat-treatment steps and in which the concentration of the impurities has been controlled, is 100 ppm or less.

The present invention so configured as described above provides a method for manufacturing a thin film transistor comprising each film of a silicon film in which the concentration of the impurities has been controlled, an insulation film and a conductive film, wherein the step for forming the insulation film comprises coating polysilazane on the substrate, and heat-treating the coated polysilazane for converting it into a $SiO_2$ film.

The present invention so configured as described above provides a method for manufacturing a thin film transistor comprising each film of a silicon film in which the concentration of the impurities has been controlled, an insulation film and a conductive film, wherein the step for forming the conductive film comprises forming a coating film by coating a liquid material containing a metal on the substrate, heat-treating the coating film for converting it into a conductive film, and patterning the conductive film.

The present invention so configured as described above provides a method for manufacturing a thin film transistor, wherein the step for forming the conductive film comprises forming a conductive film on the substrate by a plating method, and patterning the conductive film.

The present invention so configured as described above provides a method for manufacturing a thin film transistor, wherein the step for forming the conductive film comprises forming a coating film by coating an organic compound containing indium and tin on the substrate, and heat-treating the coating film for converting it into an ITO film.

The present invention so configured as described above provides a method for manufacturing a thin film transistor, wherein the liquid material for forming the silicon film, in which the concentration of the impurities has been controlled, is a solution containing a silicon compound comprising a cyclic group represented by a general formula of $Si_nX_m$ (wherein n denotes an integer of 5 or more, m denotes an integer of n, 2n−2 or 2n, and X represents a hydrogen atom and/or a halogen atom). Preferably, n is 5 or more and 20 or less in the silicon compound comprising a cyclic group represented by a general formula of $Si_nX_m$.

The present invention also provides a method for manufacturing a thin film transistor, wherein the liquid material for forming the silicon film in which the concentration of the impurities has been controlled is a solution containing a silicon compound represented by a general formula of $Si_aX_bY_c$ (wherein X represent a hydrogen atom and/or a halogen atom, Y represents a boron atom or a phosphorous atom, a denotes an integer of 3 or more, b denotes an integer of a or more and (2a+c+2) or less, and c denotes an integer of 1 or more and a or less). Preferably, (a+c) is 5 or more and 20 or less in the silicon compound described above.

In the present invention so configured as described above, the solution containing the silicon compound preferably has a concentration of 1 to 80% by weight. It is preferable that the solution has a viscosity of 1 to 100 mPa.s. It is also preferable that the solution contains a solvent having a vapor pressure of 0.001 to 100 mmHg. The solvent is preferably a hydrocarbon based solvent.

The present invention also provides a method for forming a thin film transistor comprising each film of a silicon film in which the concentration of impurities has been controlled, an insulation film and a conductive film, wherein all the thin films or most of the thin films of each thin film are formed by a method using liquid materials, and the thin films are formed by a method not using an evacuation apparatus.

The present invention also provides a method for forming a thin film transistor comprising each film of a silicon film in which the concentration of impurities has been controlled, an insulation film and a conductive film, wherein the thin film transistor comprises a transparent conductive film, all the thin films or most of the thin films of each thin film are formed by a method using liquid materials, and the thin films are formed by a method not using an evacuation apparatus.

The present invention so configured as described above provides a method for forming a thin film transistor, wherein the method for forming a coating film by coating the liquid material on the substrate comprises any one of a roll-coat method, curtain coat method, dip-coat method, spray method or ink-jet method, or a combined method of any one of the foregoing methods and a spin-coat method in the method for forming each thin film with the liquid materials.

DETAILED DESCRIPTION OF PREFERRED EMBODIMENTS

Thin films constituting a thin film transistor comprise a silicon film, an insulation film and a conductive film, and a transparent conductive film is further used in the thin film transistor to be used for a liquid crystal display device. These thin films have been mainly formed using a CVD apparatus and sputtering apparatus. However, the method for forming the thin film using the conventional CVD method and sputtering method involved the problems of low productivity, high incidence of film defects and low manufacturing yield, uneven film thickness at rough portions on the surface, and breakage of wiring lines at the steps. These problems lead to a problem that the manufacturing cost of the thin film transistor manufactured by the methods described above is increased. These problems in the CVD method and sputtering method arise from intrinsic features of these film deposition methods such as use of an evacuation apparatus, need of heating the substrate, and requirement of a power source for generating a plasma, besides causing film defects by foreign substances appeared from peeled pieces of excess deposition films formed on the inner wall of the apparatus other than on the substrate. These intrinsic features also involve the problems of high facility cost due to large scale apparatus and high running cost of the apparatus.

Figure 1:
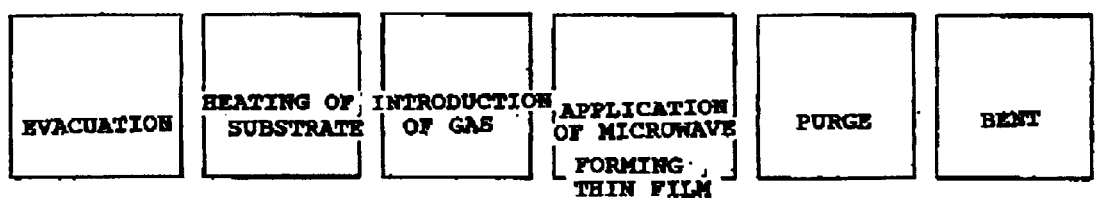
FIG. 1 is a process flow chart for forming a thin film by the conventional CVD method.

FIG. 1 shows a standard manufacturing process for film deposition by the conventional CVD method. The substrate placed in a CVD apparatus is evacuated after being transferred into a load-lock chamber, and is heated after being transferred into a heating chamber followed by film deposition by being transferred into a process chamber. The process chamber has a heating mechanism for maintaining the temperature of the substrate. A microwave is applied for forming a plasma of an introduced gas for film deposition by applying the microwave after the gas pressure has been stabilized. The remaining gas is purged after the film deposition, and the substrate is transferred into the load-lock chamber to take out into the air after the vacuum of the load-lock chamber is released via a vent. Since the process gas to be used in the CVD method mostly comprise a toxic or combustible gas, a gas-leak sensor and a pollutant elimination apparatus for rendering the exhaust gas harmless should be installed for the sake of safety control of the CVD apparatus. The toxic or combustible gas should be thoroughly purged in the gas-purge step, forcing to waste a long time before completing the film deposition process.

Films are deposited in the sputtering method by an almost the same treatment step as in the CVD method as shown in FIG. 1. The sputtering method differs from the CVD method in that an inert gas such as Ar is mostly used and toxic and combustible gases are seldom used, and a DC power source is used instead of the microwave. However, these are slight differences in comparison with the entire manufacturing process and constitution of the apparatus for forming the thin film as a whole. The sputtering method also involves the same problems as those in the CVD method in that the apparatus has a large size and the productivity is low.

On the contrary, the thin film is formed starting from liquid materials. The major process comprises forming a coating film of the liquid material on a substrate, and heat-treating for converting the coating film into a functional film. The coating film is formed by a spin-coat method, roll-coat method, curtain-coat method, dip-coat method, spray method and ink-jet method. The structure of a coating apparatus to be used for these methods is quite simple, because it is basically formed of a stage or a holder that holds the substrate, and a mechanism that coats a liquid on the substrate. While the apparatus used in a heat-treatment step and/or light irradiation step comprises a heat-treatment apparatus such as an oven, a baking furnace and an annealing furnace, and a light irradiation apparatus using a halogen lamp or UV lamp as a light source, these apparatus also have a very simple structure because no evacuating system is used.

Figure 2:
FIG. 2 is a process flow chart for forming a thin film using the liquid materials according to the present invention.
Figure 3:
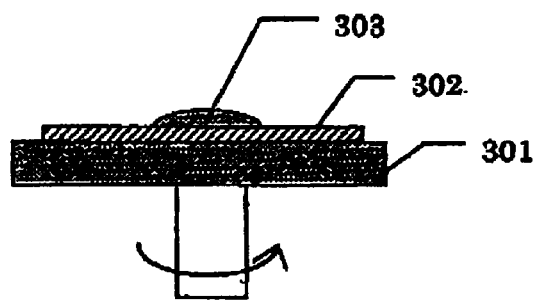
FIG. 3 illustrates a method for forming a coating film by the spin-coat method.

FIG. 2 shows a method for forming a thin film from a liquid material, which is a basic method for forming the thin film. This method comprises two steps of forming a coating film and forming a thin film as shown in FIG. 2. While control of the atmosphere is required depending on the liquid material used, an atmospheric pressure is basically used. One can recognize how short is the process of the method for forming the thin film according to the present invention, by comparing the method according to the present invention with the conventional CVD and sputtering method. The apparatus for forming a coating film by, for example, a spin-coat method as shown in FIG. 3 only requires a stage 301 that is able to rotate, and a mechanism 303 for dropping the liquid material onto the substrate 302 placed on the stage. The basic constructions of the film coating apparatus by the roll-coat method, curtain-coat method, dip-coat method, spray method and ink-jet method other than the spin-coat method is the same as that of the spin coat method, and they have a very simple structure as compared with the CVD apparatus and sputtering apparatus. The heat-treatment apparatus shown in FIG. 2 also has a basic structure comprising a stage or holder on which the substrate is placed, and a heating mechanism, and no evacuation apparatus is required. Accordingly, it can be understood that the apparatus used in the present invention is a small and cheap apparatus with a large production ability, as compared with the conventional CVD apparatus and sputtering apparatus.

Impurities for determining electrical conduction types are introduced into the silicon film constituting active layers of the thin film transistor, and the concentration of the impurities should be strictly controlled depending on the electrical characteristics of the thin film transistor. While an ion-implantation method has been used for introducing the impurities, an expensive and large size ion-implantation apparatus is not needed according to the method for forming the silicon film, in which the impurity concentration has been controlled using the liquid material according to the present invention.

In the method for forming the thin film transistor according to the present invention, the liquid material is coated on the substrate. However, most of the liquid material dropped onto the substrate is scattered off by the rotation of the substrate, and a very small portion of the liquid is actually utilized for forming the coating film. For solving the problem above, an ink-jet method is combined with the spin-coat method, or the coating film is formed by the ink-jet method.

Figure 4:
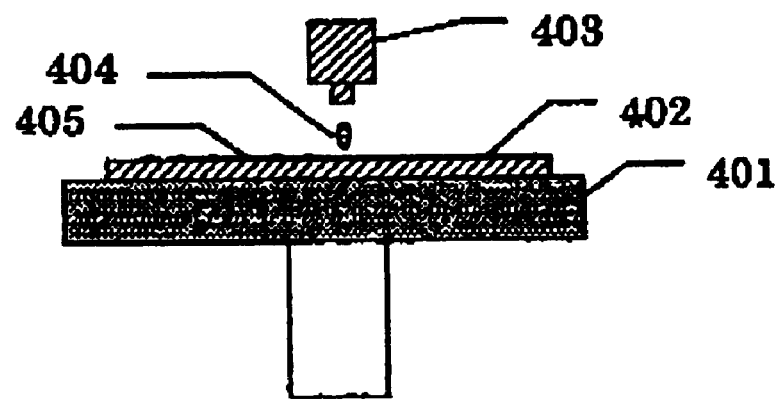
FIGS. 4(a) and 4(b) illustrate a method for forming a coating film by a combination of an ink-jet method and the spin-coat method.
Figure 4:
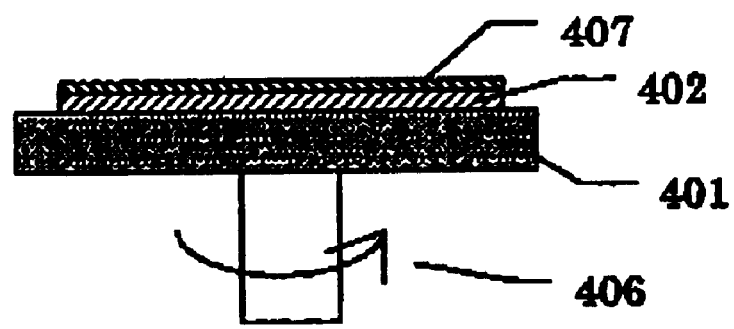

FIG. 4 shows a combination of the ink-jet method and spin-coat method for forming the coating film. In FIG. 4(a), the substrate 402 is placed on a stage 401 that is able to rotate, and the liquid material 404 discharged from an ink-jet head 403 forms fine droplets 405 on the substrate. Then, when the stage 401 rotates around a rotation axis 406 as shown in FIG. 4(b), a coating film 407 is formed. Although service efficiency of the material is a few percentage at best in the spin-coat method, the service percentage of the material can be enhanced to several tens percentage by the method shown in FIG. 4. It is possible to enhance the service efficiency of the material up to 90% or more in the method for forming the coating film at the required sites only using the ink-jet method only.

The present invention is provided for solving the intrinsic problems of the conventional film deposition methods, providing a method for manufacturing the thin film transistor with low cost, by forming the thin films with high productivity, low incidence of film defects, high manufacturing yield, good coverage of the steps using a small and cheap apparatus.

All or a part of the thin films such as silicon film in which the concentration of the impurities has been controlled, insulation film and conductive film constituting the thin film transistor are formed using the liquid materials. The basic steps for forming the thin films comprise forming the coating film by coating the liquid material on the substrate, and heat-treating the coating film to convert it into a thin film. However, the method also comprises forming a desired thin film on the substrate by dipping the substrate in the liquid material.

A solution containing a silicon compound is used for forming the silicon film in which the concentration of the impurities has been controlled in the present invention. The silicon compound comprises a cyclic group represented by a general formula of $Si_nX_m$ (wherein n denotes an integer of 5 or more, m denotes an integer of n, 2n−2 or 2n, and X represents a hydrogen atom and/or a halogen atom). In particular, n is preferably 5 or more and 20 or less, more preferably 5 or 6, in the silicon compound represented by the general formula of $Si_nX_m$. Handling of the silicon compound becomes difficult when n is smaller than 5 since the silicon compound itself turns out to be unstable due to distortion of its cyclic structure, while solubility of the silicon compound decreases due to an aggregation force of the compound when n is larger than 20, making the selection range of practically available solvents to be narrow.

Examples of the silicon compound represented by the general formula with one cyclic group include cyclopentasilane, silylcyclopentasilane, cyclohexasilane, silylcyclohexasilane, and cycloheptasilane; and those with two cyclic groups include 1,1'-biscyclobutasilane, 1,1'-biscyclopentasilane, 1,1'-biscyclohexasilane, 1,1'-biscycloheptasilane, 1,1'-cyclobutasilyl cyclopentasilane, 1,1'-cyclobutasilyl cyclohexasilane, 1,1'-cyclobutasilyl cycloheptasilane, 1,1'-cyclopentasilyl cyclohexasilane, 1,1'-cyclopentasilyl cycloheptasilane, 1,1'-cyclohexasilyl cycloheptasilane, spiro[2,2]pentasilane, spiro[3,3] heptasilane, spiro[3,3]nonasilane, spiro[4,5]decasilane, spiro[4,6]undecasilane, spiro[5,5]undecasilane, spiro[5,6] dodecasilane, and spiro[6,6]tridecasilane.

Examples of polycyclic compounds include the hydrogenated silicon compound represented by the formulas 1 to 5 below:

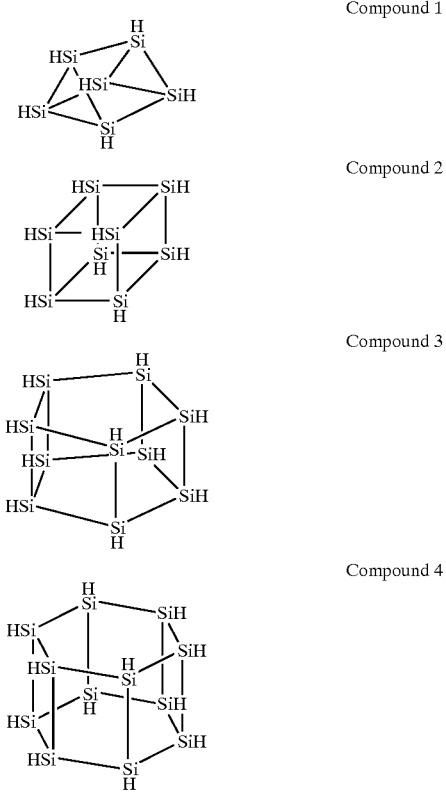

Compound 5

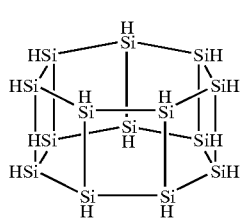

Silicon compounds in which hydrogen atoms in the framework of these compounds are partially substituted with SiH$_3$ groups and halogen atoms may be included other than the silicon compounds described above. These compounds may be used alone, or in combination thereof. 1,1'-biscyclopentasilane, 1,1'-biscyclohexasilane, spiro[4,4]nonasilane, spiro[4,5]decasilane, spiro[5,5]undecasilane, and spiro[5,6]dodecasilane, and silicon compounds having the SiH$_3$ groups in the framework are particularly preferable from the point of solubility in solvents.

While a solution containing the silicon compound having a cyclic group represented by the general formula of Si$_n$X$_m$ is used as the silicon compound to be used for forming the silicon film in the present invention, silicon compounds such as n-pentasilane, n-hexasilane and n-heptasilane may be contained in the solution.

The silicon compounds contained in the liquid material to be used for forming the silicon film, in which the concentration of the impurities has been controlled, according to the present invention include modified silane compounds represented by the general formula of Si$_a$X$_b$Y$_c$ (wherein X represent a hydrogen atom and/or a halogen atom, Y represents a boron atom or a phosphorous atom, a denotes an integer of 3 or more, b denotes an integer of a or more and (2a+c+2) or less, and c denotes an integer of 1 or more and a or less). X in the formula represents halogen atoms such as a fluorine atom, chlorine atom, bromine atom and iodine atom, and Y in the formula represents a boron atom or phosphorous atom. The modified silane compound is converted into silicon modified with the boron atom or phosphorous atom, when the modified silane compound is decomposed by heat or light, or irradiated with a laser, in an inert gas atmosphere or in a reducing gas atmosphere. The following relations are valid with respect to a, b and c in the formula: a is an integer of 3 or more; b is an integer equal to a or larger and equal to (2a+c+2) or smaller; and c is an integer of 1 or more and a or less. When a is smaller than 3, a good modified silane film can be hardly formed because the modified silane compound is a gas or liquid.

The value of (a+c) is preferably 5 or more and 20 or less, more preferably 5 or 6, in the silicon compound represented by the general formula of Si$_a$X$_b$Y$_c$. When n is smaller than 5, handling of the silicon compound becomes difficult because the compound is unstable due to distortion of the cyclic structure of the silicon compound itself. When the value of (a+c) is larger than 20, on the other hand, solubility of the silicon compound in a solvent is so decreased due to aggregation force among the silicon compounds, that the selection range of the practically available solvents turns out to be narrow.

Examples of the compounds represented by the general formula of Si$_a$X$_b$Y$_c$ include the modified silane compounds represented by the formula 6 to 27 below.

Compound 6

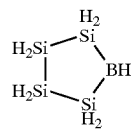

Compound 7

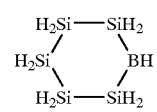

Compound 8

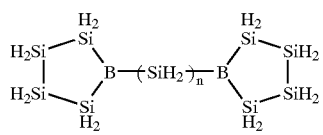

Compound 9

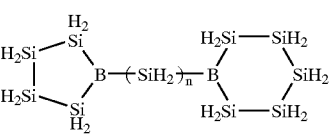

Compound 10

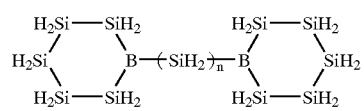

Compound 11

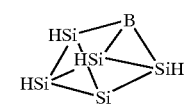

Compound 12

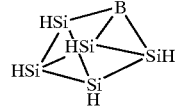

Compound 13

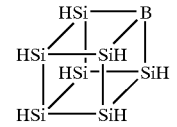

Compound 14

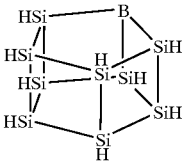

Compound 15

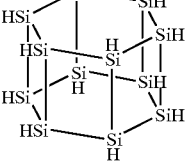

Compound 16

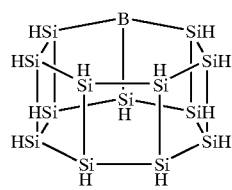

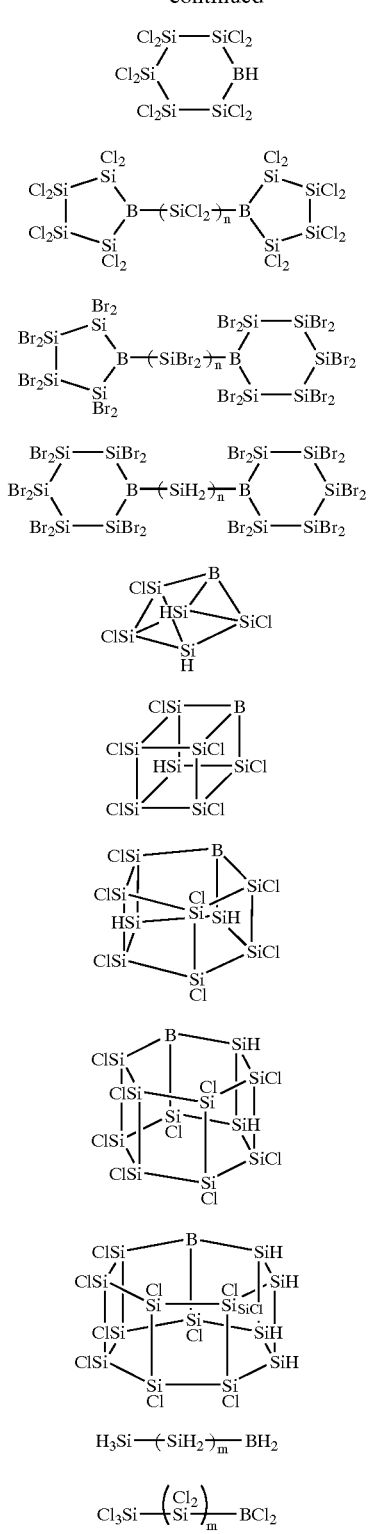

Compound 17
Compound 18
Compound 19
Compound 20
Compound 21
Compound 22
Compound 23
Compound 24
Compound 25
Compound 26
Compound 27

The integer n in the compounds 8, 9, 10, 18, 19 and 20 is zero or more, and m in the compounds 26 and 27 represents an integer of 2 or more. While these formulae represent silane compounds modified with boron, the silane compounds modified with phosphorous may have the same frames as the silane compounds modified with boron.

The modified silane compounds may be used alone as the silane compound in the solution in the present invention, or they may be used by mixing with non-modified silane compounds. While the mixing ratio between the modified and non-modified silane compounds may be different depending on the content of the modifying elements such as boron and phosphorous in the modified silane compound, it is about 1 ppb to 25% relative to the content of the silicon atoms.

A solution prepared by dissolving the silicon compound of the general formula $Si_nX_m$ and/or the modified silicon compound of the formula $Si_aX_bY_c$ in a solvent is used for the liquid material for forming the silicon film according to the present invention in which the concentration of the impurities has been controlled. The solvent to be used for the solvent above has a vapor pressure of 0.001 to 200 mmHg at room temperature. When the vapor pressure is higher than 200 mmHg, the solvent is evaporated before forming a coating film making it difficult to form a good coating film. When the vapor pressure is lower than 0.001 mmHg, on the other hand, drying is so slow that the solvent is liable to be left behind in the coating film of the silicate compound, also making it difficult to obtain a good quality of the silicon or modified silicon film after applying a heat and/or light irradiation treatment.

While the solvents to be used in the present invention are not particularly limited, provided that they dissolve the silicon compound and do not react with the silicon compound, examples of them include hydrocarbon solvents such as n-hexane, n-heptane, n-octane, n-decane, dicyclopentane, benzene, toluene, xylene, dulene, indene, tetrehydronaphthalene, decahydronaphthalene and squalane, as well as ether solvents such as dipropylether, ethyleneglycol dimethylether, ethyleneglycol diethylether, ethyleneglycol methylethylether, diethyleneglycol diethylether, diethyleneglycol methylethylether, tetrahydrofuran, tetrahydropyrane, 1,2-dimethoxyethane, bis(2-methoxyethyl)ether and p-dioxane; and polar solvents such as propylene carbonate, g-butyrolactone, N-methyl-2-pyrrolidone, dimethylformamide, acetonitrile, dimethylsulfoxide and chloroform. Hydrocarbon solvents and ether solvents are preferable among these solvents from the point of solubility of the silicon compound and modified silicon compound and stability of the solution, and the more preferable solvent is a hydrocarbon solvent. These solvents may be used alone, or as a combination of two or more of these solvents. The hydrocarbon solvents are particularly suitable since they can improve solubility of the silicon compound and suppress residual compounds of the silicon compound by the heat-treatment or light irradiation treatment as will be described hereinafter.

The silicon film according to the present invention in which the concentration of the impurities has been controlled is formed without feeding any gases as in the conventional CVD method, but is formed by the steps comprising: coating a solution prepared by dissolving the silicon compound on the substrate; forming a film of the silicon compound by drying; and converting the film of the silicon compound into a metallic silicon film by heat decomposition and/or photo-decomposition, or converting the film into a polycrystalline silicon film by a laser treatment in addition to heat decomposition and/or photo-decomposition. When the modified silicon compound is particularly used, a p-type or n-type silicon film can be formed without ion-implantation of the silicon film modified with boron atoms or phosphorous atoms in a vacuum.

The spin-coat method, roll-coat method, curtain coat method, dip-coat method, spray method and ink-jet method may be used for coating the solution containing the silicon compound. The solution is usually coated at room temperature. Solubility of the silicon compound is decreased and a part of the compound often precipitates at a temperature below the room temperature. The solution is preferably coated in an inert gas atmosphere such as nitrogen, helium and argon in which oxygen is eliminated. A reducing gas such as hydrogen is preferably mixed with the inert gas, if necessary. While the rotational speed of the spinner used in the spin-coat method is determined depending on the thickness of the thin film to be formed, and the composition of the coating solution, it is generally 100 to 5000 rpm, preferably 300 to 3000 rpm. A heat-treatment is applied to remove the solvent after coating. While the heating temperature differs depending on the kind and boiling point (vapor pressure) of the solvent used, it is usually 100° C. to 200° C. It is preferable to use an inert gas atmosphere such as nitrogen, helium and argon, as in the coating step above.

The coating film containing the silicon compound is converted into the silicon film by heat- and/or photo-treatment in the present invention. While the silicon film obtained in the present invention is amorphous or polycrystalline, an amorphous silicon film is usually obtained by a heat treatment at a final temperature of about 550° C. or less, and a polycrystalline silicon film is usually obtained by a heat treatment at a final temperature of more than 550° C. The silicon film is heat-treated preferably at 300° C. to 550° C., more preferably at 350° C. to 500° C., when the amorphous silicon film is to be obtained. When the final temperature is less than 300° C., heat decomposition of the silicon compound does not proceed sufficiently that a silicon film with a sufficient thickness cannot be obtained. It is preferable to use an inert gas such as nitrogen, helium and argon, or an inert gas mixed with a reducing gas such as hydrogen, as the atmosphere for the heat-treatment. When a polycrystalline silicon film is to be obtained, the amorphous silicon film obtained as described above can be converted into the polycrystalline silicon film by irradiating a laser beam to the polycrystalline silicon film. It is also preferable to use an inert gas such as nitrogen, helium and argon, or a mixed gas of the inert gas and a reducing gas such as hydrogen containing no oxygen, as an atmosphere for irradiating a laser.

Light-irradiation treatment may be applied to the coating film of the silicon compound film before and/or after removing the solvent in an inert gas atmosphere from which oxygen is eliminated. Not only does the silicon compound soluble in a solvent change to a insoluble tough coating film by a reaction induced by the light irradiation treatment, but it is also converted into a silicon film having excellent photoelectric characteristics by applying a heat-treatment after or simultaneously with the light irradiation treatment.

The light source to be used for the light irradiation treatment for converting the silicon compound into the silicon film comprises a low pressure or high pressure mercury vapor lamp, a deuterium lamp, arc lamp, or glow discharge lamp of a rare gas such as argon, krypton and xenon, as well as a YAG laser, argon laser, carbon dioxide laser, and eximer lasers of such as XeF, XeCl, XeBr, KrF, KrCl, ArF and ArCl. While these light sources have usually an output power of 10 to 5000 W, an output power of 100 to 1000 W is sufficient for the purpose of the present invention. While the wavelength of these light sources is not particularly restricted provided that the silicon compound can absorb the light, it is usually in the range of 170 nm to 600 nm, and the light having a sufficient intensity in the wavelength region of 170 nm to 380 nm is particularly preferable from the point of absorption efficiency. The laser light is particularly preferable from the point of conversion efficiency to the polycrystalline silicon film. The temperature during the light irradiation treatment is usually from room temperature to 500° C., and the temperature may be appropriately selected depending on the semiconductor characteristics of the silicon film obtained.

The concentration of the silicon compound solution according to the present invention is about 1 to 80%, and may be adjusted depending on the desired thickness of the silicon film. A uniform coating film cannot be obtained from a solution with a concentration of more than 80%, because the solute is readily precipitated.

A trace amount of a fluorine based, silicone based or nonionic surface tension adjusting agent may be added in the solution within a range not compromising objective functions. The nonionic surface tension adjusting agent makes wettability of the solution to the coating object good, improves leveling properties of the coating film, and serves for preventing granular or rough surface of the coating film from generating.

The nonionic surface active agents as described above include a fluorine based surface active agent, a fluorine based surface active agent containing a fluorinated alkyl group or perfluoroalkyl group, or a polyetheralkyl based surface active agent having an oxyalkyl group. Examples of the fluorine based surface active agents include $C_9F_{19}CONHC_{12}H_{25}$, $C_8F_{17}SO_2NH-(C_2H_4O)_6H$, $C_9F_{17}O$ (Pullronick L-35)$C_9F_{17}$, $C_9F_{17}O$(Pullronick P-84)$C_9F_{17}$, and $C_9F_7O$(Tetronic 704)$(C_9F_{17})_2$, wherein Pullronick L-35 is a polyoxypropylene-polyoxyethylene block copolymer with a mean molecular weight of 1,900 made by Asahi Electrochemical Co.; Pullronick P-84 is a polyoxypropylene-polyoxyethylene block copolymer with a mean molecular weight of 4,200 made by Asahi Electrochemical Co.; and Tetronic 704 is a N,N,N',N'-tetrakis (polyoxypropylene-polyoxyethylene) block copolymer with a mean molecular weight of 5,000 made by Asahi Electrochemical Co.

Examples of the fluorine based surface active agent include F-TOP EF301, EF303 and EF352 (made by Shin-Akita Chemicals Co.), Megafax F171 and F173 (made by Dainihon Ink Co.), Ashahi Guard AG710 (made by Asahi Glass Co.), Florade FC170C, FC430 and FC431 (made by Sumitomo MMM Co.), Surflon S382, SC101, SC102, SC103, SC104, SC105 and SC106 (made by Asahi Glass Co.), BM1000 and 1100 (made by M-Chemie Co.), and Schsego-Fluor (made by Schwegmann Co.).

Examples of the polyetheralkyl based surface active agent include polyoxyethylene alkylether, polyoxyethylene allylether, polyoxyethylene alkylphenolether, polyoxyethylene fatty acid ester, sorbitane fatty acid ester, polyoxyethylene sorbitane fatty acid ester, and oxyethylene-oxypropylene block polymer.

Examples of these polyetheralkyl based surface active agent include Emargen 105, 430, 810 and 920, Leodol SP-40S and TW-L120, Emanol 3199 and 4110, Exel P-40S, Bridge 30, 52, 72 and 92, Arassel 20, Emasol 320, Tween 20 and 60, Marge 45 (all of them are made by Kao Co.), and Nonipol 55 (made by Sanyo Chemicals Co.). The nonionic surface active agent other than those described above are, for example, polyoxyethylene fatty acid ester, polyoxyethylene sorbitane fatty acid ester, and polyalkyleneoxide block copolymer, and example of them include Chemistatt 2500 (made by Sanyo Chemicals Co.), SN-EX9228 (made by Sun-Nobuko Co.), and Nonal 530 (made by Toho Chemical Industries, Co.). These nonionic surface active agents are used preferably in an amount of 0.01 to 10 parts by weight, in particular in an amount of 0.1 to 5 parts by weight, relative to 100 parts by weight of the combined amount of the silicon compound. The amount of 0.01 parts by weight is not preferable since the effect of the nonionic surface active agent is not displayed, while the amount of exceeding 10 parts by weight is also not preferable since the composition readily foams besides causing color change by heating.

The viscosity of the silicon compound solution prepared is usually within a range of 1 to 100 mPa.s, and can be appropriately selected depending on the purpose of coating and thickness of the coating film. A viscosity of more than 100 mpa.s makes a uniform coating film to be difficult to obtain.

The insulation film is formed using the liquid material in the present invention, so far as it is possible. The liquid material that can be used for forming the insulation film includes polysilazane and SOG, and various organic materials. The organic materials available include polyimide and acrylic materials. Although they are not suitable for the gate insulation film that greatly influences the electrical characteristics of the thin film transistor, they may be used for an interlayer insulation film and passivation films. Polysilazane and SOG that are in a liquid state at room temperature have Si—N—Si bonds and Si—O—Si bonds, respectively. Both substances may be coated on the substrate to form the coating film by the spin-coat method, roll-coat method, curtain coat method, dip-coat method, spray method and ink-jet method. The method for forming the coating film can be selected depending on the thickness and uniformity of the coating film, and the size and shape of the substrate. While an insulation film having better quality may be obtained as the heat treatment temperature after forming the coating film is higher, the temperature is appropriately selected considering heat resistance of the substrate used, and process conditions of the semiconductor device. Using polysilazane can afford an insulation film having a better film quality than using SOG, when the heat treatment temperature is relatively as low as 300 to 500° C. The insulation film may be formed on the surface of the substrate by dipping the substrate in the liquid material. For example, a $SiO_2$ film can be formed on the substrate by dipping the substrate in an aqueous fluorosilicic acid solution and adding boric acid in the aqueous solution, as disclosed in Japanese Unexamined Patent Application Publication No. 5-259154. Since the electrical characteristics of the thin film transistor is largely influenced by the film quality of and the method for forming the gate insulation film, the insulation film may be formed by a film deposition method using the conventional evacuation apparatus, or by a heat-oxidation or plasma oxidation method, particularly when a high performance thin film transistor is to be obtained.

The conductive film is formed using the liquid material in the present invention, so far as it is possible. The method for forming conductive film using the liquid material comprises forming a coating film by coating the liquid material on the substrate by the spin-coat method, and heat-treating the coating film to convert it into a conductive film; and forming the conductive film on the surface of the substrate by dipping the substrate into the liquid material. A suspension solution in which metal fine particles are dispersed in an organic solvent, or a solution prepared by dissolving an organic compound containing a metal in a solvent, may be used as the liquid material in the method using the coating film. The suspension solution containing precious metals is known in the art, which can form a metallic film of Au and Ag. Some organic compound solutions contain In and Sn, and an ITO film as a transparent conductive film may be formed from an organic compound containing In and Sn. A plating method can be used in forming the conductive film by the dipping method, which can form a metallic film such as Ni, Cu and Au films. For assuring contact resistance between the lower layer wiring lines and electrodes, or the source/drain regions of the thin film transistor, the conductive film may be formed by the sputtering method as a conventional film deposition method, or by a combination of the sputtering method and the method using the liquid material.

The present invention will be described in detail hereinafter with reference to the following examples.

EXAMPLE 1

Figure 5:
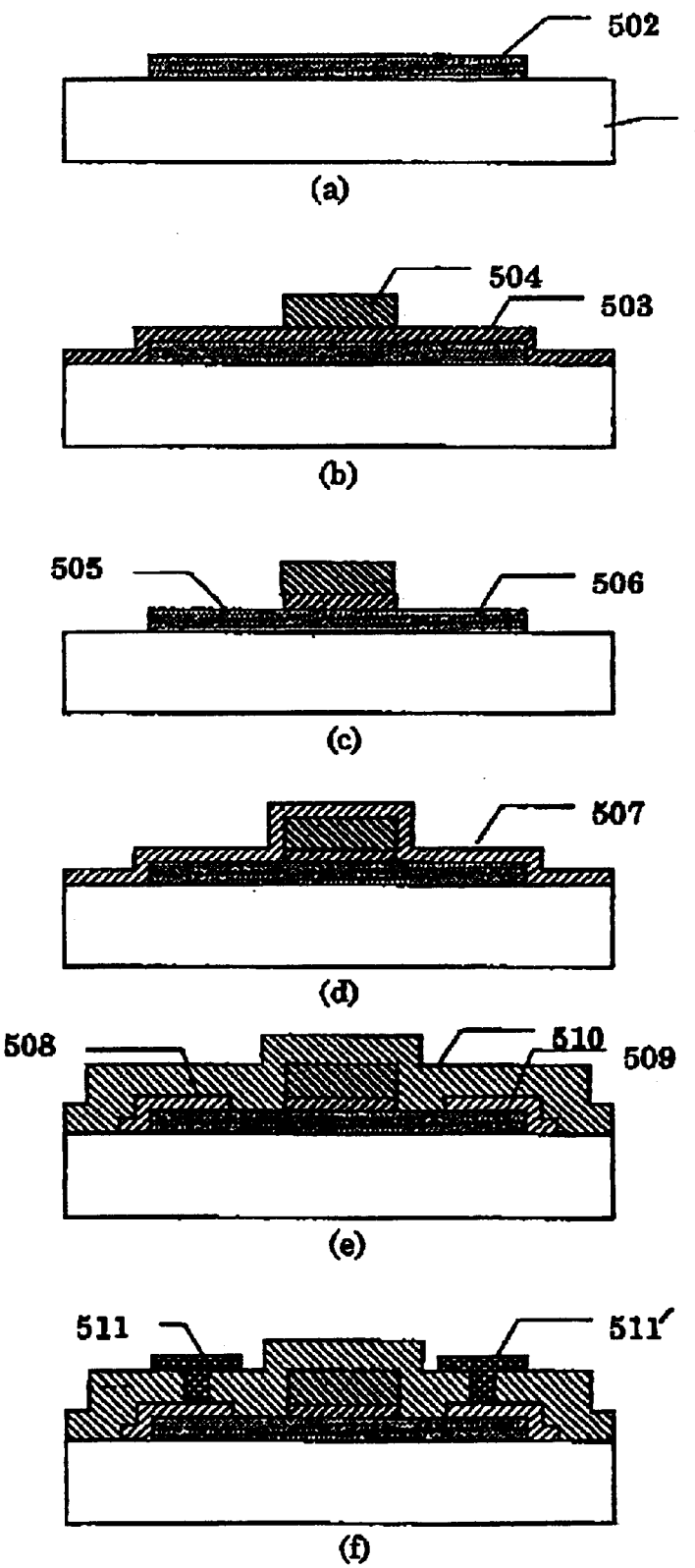
FIGS. 5(a)–5(f) are cross sectional views showing the manufacturing process of a co-planar type thin film transistor in one example according to the present invention.

Example 1 of the present invention is described with reference to FIG. 5, which show the method for manufacturing a co-planar type thin film transistor in the order of its manufacturing steps.

In FIG. 5(a), a coating film was formed on a glass substrate 501 at a rotational speed of 500 rpm using a 5% solution of a mixture of cyclopentasilane and cyclohexasilane in benzene as a solvent. Then, after removing the solvent in the coating film by a heat-treatment at 100° C. for 20 minutes, the coating film was additionally subjected to a heat-treatment at 400° C. for 20 minutes to convert the coating film into a silicon film. Subsequently, the silicon film was annealed with a laser having an energy density of 250 $mJ/cm^2$ to form a polycrystalline silicon film. Then, an islet region 502 to serve as source/drain regions and a channel region was formed by photo-etching.

While the islet region to serve as source/drain regions and a channel region was formed to be a non-dope silicon film, it may formed into a dope silicon film doped with phosphorous or boron for Vth (threshold voltage) control of the thin film transistor. A silicon compound as a mixture of cyclopentasilane and cyclohexasilane, and a silane compound modified with phosphorous or boron may be used for forming the coating film. The coating film is heat-treated and annealed with laser under an approximately similar conditions as described above. The concentrations of phosphorous or boron in the dope silicon film may be controlled by adjusting the mixing ratio between the silicon compound and the modified silane compound.

A laminated film of the coating film using the silicon compound and the coating film using the silane compound modified with phosphorous or boron can be used for controlling the concentration of phosphorous or boron in the dope silicon film. The impurities in the dope silicon film diffuse into the non-dope silicon film, by a laser annealing after forming the laminated film. The concentration of the impurities can be controlled by the thickness of the coating film, and the conditions of the laser annealing.

In the next step, a gate insulation film 503 was formed using the liquid material as shown in FIG. 5(b). At first, a 5% polysilazane solution in xylene as a solvent was coated on the substrate at a rotational speed of 2000 rpm to form a coating film with a thickness of 1200 Å. Then, the solvent in the coating film was removed by baking at 80° C. for 30 minutes, and the coating film was modified into a $SiO_2$ film by a heat-treatment at 350° C. for 30 minutes to form a gate insulation film. While the heat-treatment at 350° C. was carried out in an atmosphere containing oxygen, electrical characteristics of the gate insulation film as well as the MOS interface characteristics may be improved by heat-treating in an atmosphere containing oxygen and water vapor, thereby enabling reliability of the thin film transistor to be improved.

Subsequently, a gate electrode 504 is formed from the liquid material. While a dope silicon film formed by using the liquid material, a metallic film formed by using a suspension solution of metal fine particles, or a metallic film formed by plating may be used for the gate electrode, an ITO film formed with the liquid material was used in this example. At first, a coating film is formed on the substrate at a rotational speed of 1500 rpm using a 8% concentration of an organic compound containing indium and tin in xylene as a solvent. Then, the solvent was removed by heat-treating at 80° C., followed by a heat-treatment at 300° C. to form a ITO film with a thickness of 2000 Å. A gate electrode 504 as shown in FIG. 5(b) was formed in the next step by photo-etching. Resistivity of the ITO film may be further reduced by taking out the substrate in the air after heat-treating at 300° C. for 30 to 60 minutes, followed by cooling the substrate in a reducing atmosphere containing hydrogen at 200° C., desirably at 150° C.

In the next step, the gate insulation film is removed using the gate electrode as a mask as shown in FIG. 5(c) to expose the silicon films 505 and 506 that serve as source/drain regions.

Subsequently, a dope silicon film 507 is formed using the liquid material containing silicon atoms or boron atoms as shown in FIG. 5(d). The dope silicon film is formed so as to cover the exposed source/drain regions 505 and 506. A solution of a silicon compound modified with phosphorous in toluene as a solvent was used in this example for the liquid material containing silicon atoms or phosphorous atoms. The solution was coated on the substrate by spin-coating, and the solvent was removed by heat-treating at 150° C. The substrate was then converted into a dope amorphous silicon film by heat-treating at 350° C., followed by laser annealing by a XeCl laser. The silicon film is changed to a polycrystalline film by laser annealing, and phosphorous is simultaneously diffused from the dope silicon film into the silicon film at the lower layer, thereby the source/drain regions 505 and 506 are formed as n-type polycrystalline silicon.

Subsequently, the n-type polycrystalline silicon is photo-etched to form a part of the source/drain regions (508, 509) as shown in FIG. 5(e). Since the source/drain regions are consequently formed to be a partially two-storied structure, the upper stair portion is formed so as to open at least a contact hole for pulling out the electrodes of the source/drain region. Then, an interlayer insulation film 510 was formed using polysilazane. A 10% solution is at first coated on the substrate at a rotational speed of 1000 rpm to form a coating film. Then, xylene as a solvent is removed by baking at 80° C., and subsequently a $SiO_2$ film with a thickness of 5000 Å was formed by heat-treating at 350° C. While the heat-treatment at 350° C. was carried out in an atmosphere containing oxygen, electrical characteristics as well as reliability as an insulation film may be improved by heat-treating in an atmosphere containing oxygen and water vapor.

After opening contact holes on the interlayer insulation film in the next step, the electrode 511 for the source/drain regions was formed using the liquid material as shown in FIG. 5(f). A suspension solution in which metal fine particles are dispersed in an organic solvent, or a solution prepared by dissolving an organic compound containing indium and tin may be used as the liquid material to be used for forming the electrodes. A thin film such as a nickel film formed by electroless plating may be also utilized. When a thin film transistor comprising a transparent electrode to be used for the liquid crystal display device is formed, an organic compound containing indium and tin may be used for the liquid material for forming the transparent conductive film. A suspension solution prepared by dispersing gold particles with a diameter of several angstrom in an organic solvent was used in this example. A coating film was formed by coating the suspension solution on the substrate, and the coating film was converted to the conductive film by heat-treating it at 200° C., followed by patterning the conductive film to form the electrodes 511 and 511' as shown in FIG. 5(f).

EXAMPLE 2

Example 2 according to the present invention is described with reference to FIGS. 6(a) to 6(f). The manufacturing process of the stagger type thin film transistor is shown according to the manufacturing steps.

Figure 6:
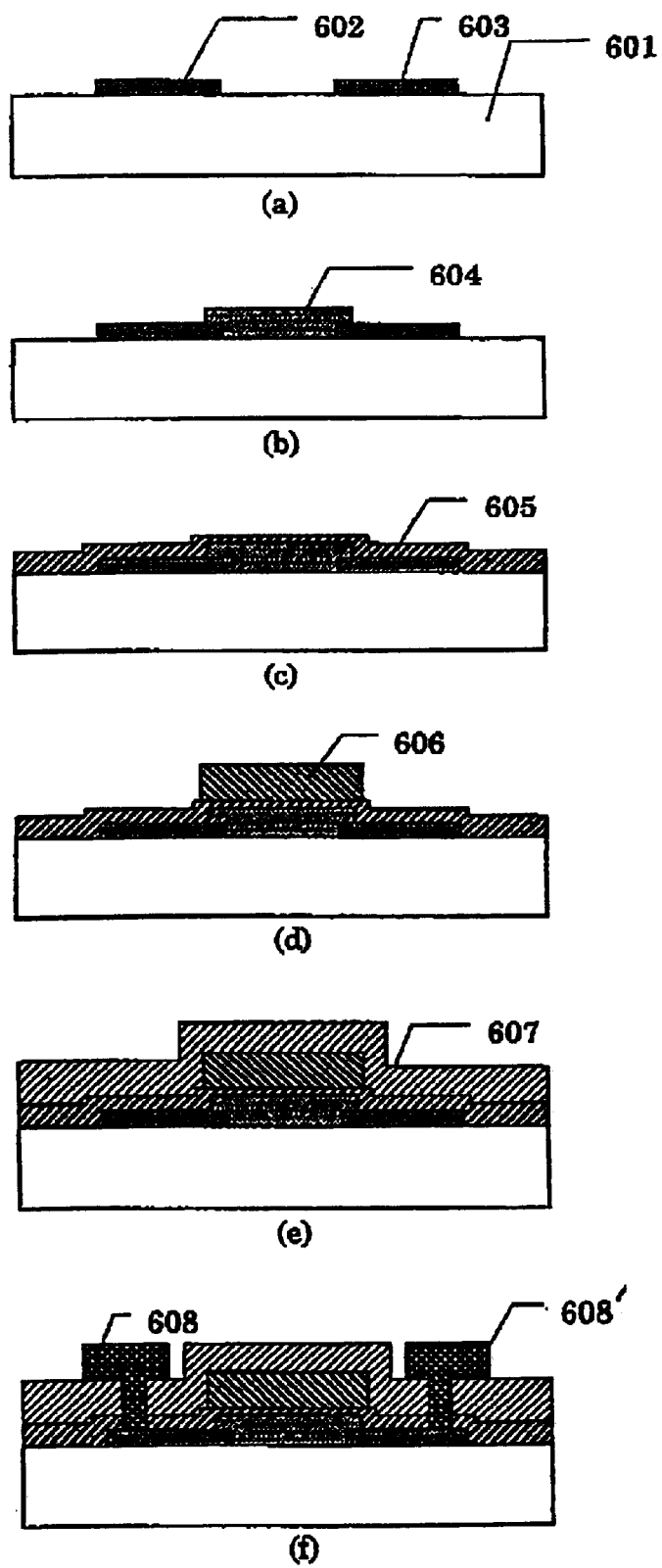
FIGS. 6(a)–6(f) are cross sectional views showing the manufacturing process of a stagger type thin film transistor in an another example according to the present invention.

In FIG. 6(a), the reference numeral 601 shows a glass substrate, and the reference numerals 602 and 603 show dope silicon films in which impurities to serve as source/drain regions are doped. A silane compound modified with phosphorous was used in forming the dope silicon film. A coating film is formed by coating the solution of the silane compound modified with phosphorous on the substrate by the spin-coating method. Then, the solvent in the coating film is removed by heat-treating at 80° C. to 150° C., followed by a heat-treatment at 350° C. for 30 minutes to convert the coating film into an amorphous dope silicon film. Then, the dope silicon film is annealed with a laser having an energy density of about 300 mJ/cm$^2$ to change the dope silicon film to a polycrystalline film. Subsequently, the source/drain regions 602 and 603 are formed by patterning by photo-etching.

Subsequently, a silicon film 604 that serves as the source/drain regions is formed is formed as shown in FIG. 6(b). At first, a coating film is formed at a rotational speed of 500 rpm using a 5% solution of a mixture of cyclopentasilane and cyclohexasilane as silicon compounds in benzene as a solvent. Then, the coating film is changed to an amorphous silicon film simultaneously with removing the solvent in the coating film by a heat-treatment in which the temperature is slowly increased from 100° C. to 350° C. The silicon film was changed to a polycrystalline film thereafter by annealing with a laser having an energy density of 250 mJ/cm$^2$. Subsequently, an islet region 604 that serves as a channel region for connecting to the source/drain region was formed by photo-etching as shown in FIG. 6(b).

While the channel region was formed using the non-dope silicon film, it may be formed to be a non-dope silicon film in which phosphorous or boron was doped for the Vth (threshold voltage) control of the thin film transistor. The coating film is formed using a mixture of a silicon compound as a mixture of cyclopentasilane and cyclohexasilane, and a silane compound modified with phosphorous or boron for the purpose above. The coating film is heat-treated and annealed with a laser under the approximately same conditions as described above. The concentration of phosphorous or boron in the dope silicon film may be adjusted by the mixing ratio between the silicon compound and the modified silane.

A laminated film of the coating film using the silicon compound and the coating film using the modified silane compound modified with phosphorous or boron may be used for controlling the concentration of phosphorous or boron in the dope silicon film. The impurities in the dope silicon film diffuse into the non-dope silicon film by annealing with a laser after forming the laminated film. The concentration of the impurities may be controlled not only by the concentration of phosphorous or boron in the modified silane, but also by the thickness of each film in the laminated film, and by the laser annealing condition.

In the next step, a gate insulation film 605 is formed using the liquid material as shown in FIG. 6(c). At first, a coating film with a thickness of about 1200 Å is formed by coating a 5% solution of polysilazane on the substrate at a rotational speed of 2000 rpm. Then, the coating film was heat-treated at 300° C. for 30 minutes to form an insulation film 605 by modifying the coating film to a $SiO_2$ film.

In the next step, a gate electrode 606 is formed using the liquid material as shown in FIG. 6(d). While a dope silicon film formed by using the liquid material, a metallic film formed by using a suspension solution of metal fine particles, or a metallic film formed by plating may be utilized as the gate electrode, an ITO film formed with a liquid material was used in this example. A coating film is formed at first on the substrate at a rotational speed of 1500 rpm using a 8% solution of an organic compound containing indium and tin in xylene as a solvent. Then, the solvent is removed by heat-treating at 80° C., and an ITO film with a thickness of 2000 Å was formed by a heat-treatment at 300° C. Subsequently, a gate electrode 606 was formed as shown in FIG. 6(d) by photo-etching. The resistivity of the ITO film may be further reduced by taking out the substrate into the air after a heat-treatment at 300° C. for 30 to 60 minutes, followed by cooling at 200° C., desirably at about 150° C., in a reducing atmosphere containing hydrogen.

In the next step, an interlayer insulation film 607 is formed as shown in FIG. 6(e) using the liquid material. A coating film is formed at first by coating a 10% solution on the substrate at a rotational speed of 1000 rpm. Then, xylene as a solvent is removed by baking at 80° C., and the coating film was changed to a $SiO_2$ film with a thickness of 5000 Å by a heat-treatment at 350° C. While the heat-treatment at 350° C. was carried out in an atmosphere containing oxygen, the electrical characteristics as well as reliability as the insulation film may be improved by heat-treating in an atmosphere containing oxygen and water vapor.

Subsequently, after opening contact holes on the interlayer insulation film 607 as shown in FIG. 6(f), the electrodes 608 and 608' were formed using the liquid material. A suspension solution prepared by dispersing metal fine particles in an organic solvent, or a solution prepared by dissolving an organic compound containing indium and tin may be used as the liquid material to be used for the electrodes. A thin film of nickel formed by electroless plating may be also used. An organic compound containing indium and tin may be used for the transparent substrate for forming a thin film transistor comprising a transparent electrode to be used for a liquid crystal display device.

The electrodes were formed with the ITO film in this example. At first, a coating film is formed on the substrate at a rotational speed of 1500 rpm using a 8% solution of an organic compound containing indium and tin in xylene as a solvent. Then, the solvent is removed by heat-treating at 80° C., and the ITO film with a thickness of 2000 Å was formed by heat-treating at 300° C. Subsequently, the electrode 608 was formed as shown in FIG. 6(f) by photo-etching. The resistivity of the ITO film may be further reduced by taking out the substrate into the air after a heat-treatment at 300° C. for 30 to 60 minutes, followed by cooling at 200° C., desirably at about 150° C., in a reducing atmosphere containing hydrogen. The electrode described above is a transparent electrode, which can be utilized as pixel electrodes required in a liquid crystal display device.

EXAMPLE 3

Example 3 according to the present invention will be described with reference to FIGS. 7(a)–7(c), which show the method for manufacturing a reversed type stagger type transistor in the order of its manufacturing steps.

A gate electrode 702 is formed at first on a glass substrate 701 as shown in FIG. 7(a). The gate electrode was formed by electroless plating in this example. A sodium free nickel plating solution was used, and a nickel film with a thickness of about 4000 Å was formed on the substrate. While the nickel film was grown by allowing nickel to precipitate on the substrate by dipping the substrate in the plating solution, a surface cleaning step and an activator treatment are required as pre-treatment steps prior to the plating step. A solution containing sodium is usually used for these pre-treatments, however a sodium free solution was used in these pre-treatment steps in the present invention. The nickel film was patterned by a conventional photo-etching method. A mixed acid of nitric acid and glacial acetic acid was used for the etching solution of nickel.

A gate insulation film 703 was formed using a liquid material as shown in FIG. 7(b). Polysilazane with 5% concentration is coated on the substrate at a rotational speed of 200 rpm, and a coating film with a thickness of 1200 Å is formed. Then, the solvent in the coating film was removed by a heat-treatment at 80° C., followed by a heat-treatment of the coating film at 350° C. to convert it into a $SiO_2$ film as a gate insulation film 703.

Subsequently, the silicon film 704 that serves as a channel layer is formed using the liquid material as shown in FIG. 7(c). At first, a 55% solution of a mixture of cyclopentasilane and cyclohexasilane in benzene as a solvent is used as a silicon compound to form a coating film at a rotational speed of 500 rpm. After removing the solvent by a heat-treatment at 150° C., and converting the coating film into a silicon film by heat-treating at 300° C. for 30 minutes, the film was annealed with a laser with an energy density of 250 mJ/cm$^2$ to change the silicon film into a polycrystalline silicon film.

When an amorphous silicon film is to be obtained after the heat-treatment and laser annealing, the heat treatment temperature is increased over 450° C. without any laser annealing, or laser annealing is carried out at a low laser energy. However, since the proportion of amorphous portions and polycrystalline portions in the amorphous silicon film, or the proportion of silicon remaining in the film as an organic silicon depend on the heat treatment temperature and time, energy density and thickness of the film, these conditions should be optimized in order to obtain a desired amorphous silicon film.

Subsequently, an insulation layer 705 that serves as a channel protective layer, and impurity doped silicon films 706 and 707 that serve as source/drain regions are formed using the liquid material as shown in FIG. 7(d). The channel protective film may be formed using, for example, polysilazane as in forming the gate electrode. For forming a dope silicon film that serves as the source/drain regions, a coating film of a silane compound modified with phosphorous or boron is formed at first. Then, the solvent in the coating film is removed by a heat-treatment at 80 to 150° C., followed by heat-treating at 350° C. to convert the coating film into an amorphous dope silicon. Then, the dope silicon is changed to a polycrystalline silicon by laser annealing with an energy density of about 300 mJ/cm$^2$. Impurities diffuse from the dope silicon film into the non-dope silicon film at the lower layer. The silicon film is then patterned by photo-etching to form the source/drain regions 706 and 707.

Figure 7:
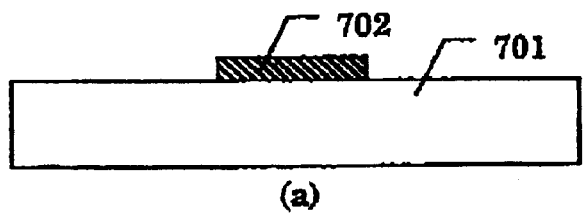
FIGS. 7(a)–7(e) are cross sectional views showing the manufacturing process of a reversed stagger type thin film transistor in a different example according to the present invention.
Figure 7:
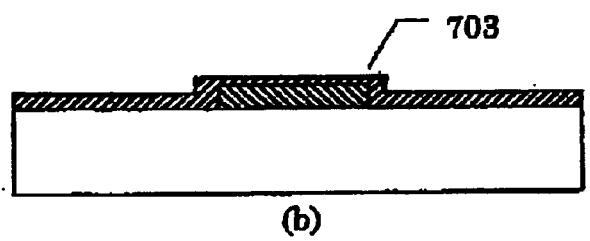
Figure 7:
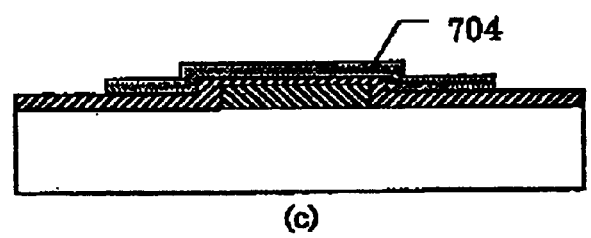
Figure 7:
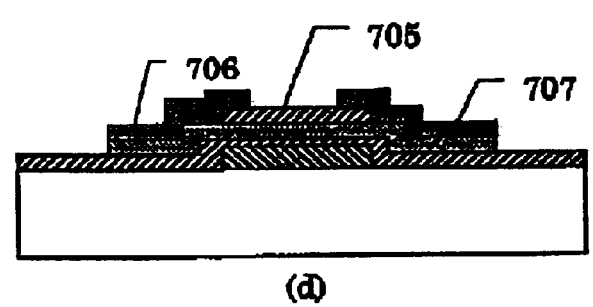
Figure 7:
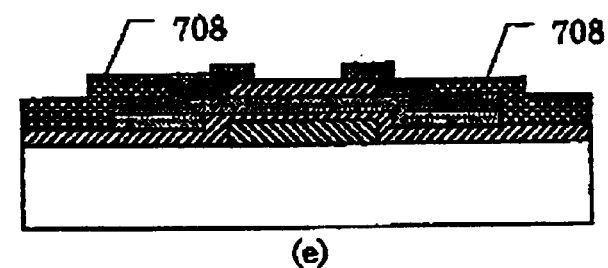

Subsequently, the electrode 708 is formed with the liquid material as shown in FIG. 7(*e*). The electrode was formed with an ITO film in this example. A coating film is at first formed on the substrate at a rotational speed of 1500 rpm using a 8% solution of an organic compound containing indium and tin in xylene as a solvent. Then, the solvent is removed by heat-treating at 80° C., and the ITO film with a thickness of 2000 Å was formed by heat-treating at 300° C. In the next step, the electrodes 708 and 708' were formed by photo-etching as shown in FIG. 7(*e*). Resistivity of the ITO film may be further reduced by taking out the substrate in the air after heat-treating at 300° C. for 30 to 60 minutes, followed by cooling the substrate in a reducing atmosphere containing hydrogen at 200° C., desirably at 150° C. The electrode described above is a transparent electrode, which may be utilized as pixel electrodes required in a liquid crystal display device.

In the method for manufacturing the thin film transistor according to the present invention, all or a part of the thin films such as the silicon film, insulation film and conductive film constituting the thin film transistor are formed using the liquid materials. The method mainly comprises forming a coating film by coating the liquid material on the substrate, and heat-treating the coating film to convert the coating film into a desired thin film. Accordingly, the present invention can solve the intrinsic problems in the conventional film deposition method such as CVD method and sputtering method, enabling the thin film to be formed with high productivity, small incidence of film defects, high manufacturing yield no breakage of wiring lines at the steps, and with low manufacturing cost using a small size and cheap apparatus, thereby manufacturing the thin film transistor with an extremely lower cost than the conventional ones.

The silicon film in which the amount of impurities has been controlled is formed a liquid material in the method for manufacturing the thin film transistor according to the present invention. Accordingly, the thin film transistor can be manufactured with low manufacturing cost, because the ion implantation method that requires use of an expansive apparatus may be eliminated for doping the impurities in the silicon film, and for controlling the amount of the impurities.

What is claimed is:

1. A method for manufacturing a thin film transistor including a doped silicon film comprising the steps of a) forming a coating film by applying a liquid material containing a compound comprising impurity atoms and silicon atoms, the liquid material being a mixture of a liquid material containing silicon atoms and a liquid material containing impurity atoms and silicon atoms in which the concentration of impurity is controlled; and b) heat-treating the coating film so as to convert the coating film into the doped silicon film.

2. The method for manufacturing a thin film transistor according to claim 1, further comprising the step of c) forming the other coating film by applying a liquid material containing silicon atoms; and d) heat-treating the other coating film so as to convert the other coating film into the non-doped silicon film, by the steps of a)–d) forming a laminated film of the non-doped silicon film and the doped silicon film.

3. The method for manufacturing a thin film transistor according to claim 2, the laminated film of the non-doped silicon film and the doped silicon film forming a channel region.

4. The method for manufacturing a thin film transistor according to claim 2, further comprising a step of heat-treating the laminated film of a non-doped silicon film and a doped silicon film.

5. The method for manufacturing a thin film transistor according to claim 4, the heat-treating step including a lamp annealing or a laser annealing.

6. The method for manufacturing a thin film transistor according to claim 1, the step of b) comprising a first heat-treating sub-step so as to remove volatile chemical species from the coating film and a second heat-treating sub-step.

7. The method for manufacturing a thin film transistor according to claim 6, the first heat-treating sub-step including a step of irradiating a light so as to accelerate a decomposition of compounds in the coating film.

8. A method for manufacturing a thin film transistor according to claim 7, the light having a wavelength ranging from 170 nm to 380 nm.

9. The method for manufacturing a thin film transistor according to claim 6, the second heat-treating sub-step proceeding at higher temperature than that of the first heat-treating sub-step so as to increase crystallinity of the doped silicon film.

10. The method for manufacturing a thin film transistor according to claim 6, the second heat-treating including a lamp annealing or a laser annealing.

11. The method for manufacturing a thin film transistor according to claim 1, further comprising a third heat-treating sub-step so as to improve crystallinity of the doped silicon film.

12. The method of manufacturing a thin film transistor according to claim 1, the liquid material containing 1 ppb to 25% of impurity atoms relative to the content of the silicon atoms.

13. The method for manufacturing a thin film transistor according to claim 1, the step of a) comprising forming a coating film by a ink-jet method.

14. The method for manufacturing a thin film transistor according to claim 13, the coating film forming an islet region.

15. The method for manufacturing a thin film transistor according to claim 1, the steps of a) and b) being carried out in an atmosphere in which the concentration of oxygen and humidity are reduced.

16. The method for manufacturing a thin film transistor according to claim 15, the atmosphere being controlled so that the concentration of oxygen contained in the silicon film is 100 ppm or less.

17. The method for manufacturing a thin film transistor according to claim 1, the liquid material including a cyclic compound.

18. The method for manufacturing a thin film transistor according to claim 17, the cyclic compound having 5~20 silicon atoms.

19. The method for manufacturing a thin film transistor according to claim 1, the liquid material for forming the silicon film in which the concentration of the impurities is controlled being a solution containing a silicon compound represented by a general formula of $Si_aX_bY_c$ (wherein X represents a hydrogen atom and/or a halogen atom, Y represents a boron atom or a phosphorous atom, a denotes an integer of 3 or more, b denotes an integer of a or more and (2a+c+2) or less, and c denotes an integer of 1 or more and a or less).

20. The method for forming a thin film transistor according to claim 19, (a+c) being 5 or more and 20 or less in the silicon compound represented by a general formula of $Si_aX_bY_c$ (wherein X represents a hydrogen atom and/or a halogen atom, Y represents a boron atom or a phosphorous atom, a and c denote integers of 3 or more, and b denotes an integer of a or more and (2a+c+2) or less).

21. The method for manufacturing a thin film transistor according to claim 1, a material having a viscosity of 1 to 100 mPa.s being used as the liquid material containing impurity atoms and silicon atoms.

22. The method for manufacturing a thin film transistor according to claim 1, a solution is used as the liquid material containing impurity atoms and silicon atoms, the solution containing 1~80% by weight of the compound containing impurity atoms and silicon atoms.

23. The method for manufacturing a thin film transistor according to claim 22, a solvent having a vapor pressure of 0.001 to 100 mmHg being used as a solvent of the solution.

24. The method for manufacturing a thin film transistor according to claim 23, the solvent being a hydrocarbon based solvent.

25. The method for manufacturing a thin film transistor according to claim 1, the doped silicon film forming at least one of source/drain regions, a channel region, a gate electrode, an electrode and a wiring pattern.

26. A method for manufacturing a thin film transistor comprising the step of:
 forming a coating film by applying a liquid material containing silicon atoms or a liquid material containing silicon atoms and impurities on an insulating substrate or an insulation film, the liquid material being a mixture of a liquid material containing silicon atoms and a liquid material containing impurity atoms and silicon atoms in which the concentration of impurity is controlled;
 heat treating the coating film to convert the coating film into a silicon film in which the concentration of the impurities is controlled;
 forming an islet region by patterning the silicon film;
 forming a gate insulation film;
 forming a gate electrode;
 exposing source/drain regions in the islet region using the gate electrode as a mask;
 forming an interlayer insulating film;
 forming contact holes in the interlayer insulation film; and
 forming electrode and wiring patterns.

27. A method for manufacturing a thin film transistor comprising the steps of:
 forming a coating film by applying a liquid material containing silicon atoms or a liquid material containing silicon atoms and impurities on an insulating substrate or an insulation film, the liquid material being a mixture of a liquid material containing silicon atoms and a liquid material containing impurity atoms and silicon atoms in which the concentration of impurity is controlled;
 heat treating the coating film to convert the coating film into a silicon film in which the concentration of the impurities is controlled;
 forming an islet region by patterning the silicon film;
 forming a gate insulation film;
 forming a gate electrode;
 exposing a part of the silicon film in the islet region by removing the gate insulation film on the part of the silicon film in the islet region using the gate electrode as a mask;
 forming a coating film by applying the liquid material containing the silicon atoms and impurities on the exposed part of the silicon film in the islet region;
 subjecting to a first heat-treatment so as to form a doped silicon film by heat-treating the coating film;
 subjecting to a second heat-treatment so as to diffuse the impurities in the doped silicon film into the silicon film;
 forming a pattern overlapping a part of the source/drain regions by patterning the doped silicon film;
 forming an interlayer insulating film;
 forming contact holes in the interlayer insulation film; and
 forming electrodes and wiring patterns.

28. A method for manufacturing a thin film transistor comprising the steps of:
 forming a coating film by applying a liquid material containing silicon atoms and impurities on an insulating substrate or insulation film, the liquid material being a mixture of a liquid material containing silicon atoms and a liquid material containing impurity atoms and silicon atoms in which the concentration of impurity is controlled;
 forming source/drain regions by heat-treating the coating film to convert the coating film into a doped silicon film;
 forming a coating film by applying a liquid material containing silicon atoms or a liquid material containing silicon atoms and impurities on the substrate;
 heat-treating the coating film for converting the coating film into the silicon film in which the concentration of the impurities is controlled;
 forming an islet region containing a channel region for connecting to the source/drain regions by patterning the doped silicon film in which the concentration of the impurities is controlled;
 forming a gate insulation film;
 forming a gate electrode;
 forming an interlayer insulation film;
 forming contact holes in the interlayer insulation film; and
 forming electrodes and wiring patterns.

29. A method for manufacturing a thin film transistor comprising the steps of:
 forming a gate electrode on an insulating substrate or insulation film;
 forming a gate insulation film;
 forming a coating film by applying a liquid material containing silicon atoms or a liquid material containing silicon atoms and impurities on the substrate, the liquid material being a mixture of a liquid material containing silicon atoms and a liquid material containing impurity atoms and silicon atoms in which the concentration of impurity is controlled;
 heat-treating the coating film for converting the coating film into a silicon film in which the concentration of the impurities is controlled;
 forming a channel protective insulation film;
 forming a coating film by applying a liquid material containing silicon atoms and impurities;
 forming source/drain regions as silicon films doped with impurities by heat-treating the coating film; and
 forming electrodes and wiring patterns.

30. A method for manufacturing a thin film transistor comprising the steps of:
 forming a doped silicon film by steps of:
  forming a coating film by applying a liquid material containing impurity atoms and silicon atoms, the liquid material being a mixture of a liquid material containing silicon atoms and a liquid material containing impurity atoms and silicon atoms in which the concentration of impurity is controlled, and at least one of heat-treating and irradiating a light so as to convert the coating film into the doped silicon film; and forming an insulation film by a step of heat treatment of a polysilazane film so as to form the insulation film, wherein the step for forming the insulation film comprises coating polysilazane on a substrate, and heat-treating the coated polysilazane for converting it into a $SiO_2$ film.

31. A method for manufacturing a thin film transistor that includes a conductive film, comprising the steps of forming a coating film by applying a liquid material containing metal, the liquid material being a mixture of a liquid material containing silicon atoms and a liquid material containing impurity atoms and silicon atoms in which the concentration of impurity is controlled, and at least one of heat-treating and irradiating a light so as to covert the coating film into the conductive film.

32. A method for manufacturing a thin film transistor including a doped silicon film comprising the steps of:

forming a coating film by applying a liquid material containing impurity atoms and silicon atoms, the liquid material being a mixture of a liquid material containing silicon atoms and a liquid material containing impurity atoms and silicon atoms in which the concentration of impurity is controlled;

heat-treating the coating film so as to convert the coating film into the doped silicon film; and plating for forming an electrode and/or wiring patterns.

33. A method for manufacturing a thin film transistor that includes a doped silicon film and an ITO film, comprising steps of:

forming the doped silicon film by steps of:
forming a coating film by applying a liquid material containing impurity atoms and silicon atoms, the liquid material being a mixture of a liquid material containing silicon atoms and a liquid material containing impurity atoms and silicon atoms in which the concentration of impurity is controlled, and at least one of heat-treating and irradiating a light so as to covert the coating film into the doped silicon film; and forming the ITO film by steps of:
forming a coating film by applying a material containing indium and tin, and heat-treating the coating film so as to convert the coating film into the ITO film.

34. The method of manufacturing a thin film transistor according to claim 33, an organic material containing indium and tin being used as the material containing indium and tin.

35. A method for manufacturing a thin film transistor that includes each film of a silicon film in which the concentration of impurities is controlled, an insulation film and a conductive film, comprising the steps of:

forming all the thin films or most of the thin films of each thin film by a method using liquid materials without using an evacuation apparatus, the liquid materials being a mixture of a liquid material containing silicon atoms and a liquid material containing impurity atoms and silicon atoms in which the concentration of impurity is controlled.

36. The method for manufacturing a thin film transistor according to claim 35, the method for forming a coating film by coating the liquid material on the substrate comprising any one of a spin-coat method, roll-coat method, curtain coat method, dip-coat method, spray method or inkjet method in the method for forming each thin film with the liquid materials.

37. The method for manufacturing a thin film transistor according to claim 35, the steps of forming all the thin films or most of the thin films of each thin film by a method using liquid materials comprising forming a coating film at the required site by an ink-jet method.

38. A method for manufacturing a thin film transistor that includes each film of a silicon film in which the concentration of impurities is controlled, an insulation film and conductive film, wherein the thin film transistor includes a transparent conductive film, comprising the steps of:

forming all the thin films or most of the thin films of each thin film by a method using liquid materials without using an evacuation apparatus, the liquid material being a mixture of a liquid material containing silicon atoms and a liquid material containing impurity atoms and silicon atoms in which the concentration of impurity is controlled.

39. The method for manufacturing a thin film transistor according to claim 38, the method for forming a coating film by coating the liquid material on the substrate comprising any one of a spin-coat method, roll-coat method, curtain coat method, dip-coat method, spray method or ink-jet method in the method for forming each thin film with the liquid materials.

40. The method for manufacturing a thin film transistor according to claim 38, the steps for forming all the thin films or most of the thin films of each thin film by a method using liquid materials comprising forming a coating film at the required site by an ink-jet method.

41. A method for manufacturing a thin film transistor including a doped silicon film comprising the steps of a) forming a coating film by applying a liquid material containing a compound comprising impurity atoms and silicon atoms, the liquid material for forming the silicon film in which the concentration of the impurities is controlled being a solution containing a silicon compound represented by a general formula of SiaXbYc (wherein X represents a hydrogen atom and/or a halogen atom, Y represents a boron atom or a phosphorous atom, a denotes an integer of 3 or more, b denotes an integer of a or more and (2a+c+2) or less, and c denotes an integer of 1 or more and a or less); and b) heat-treating the coating film so as to convert the coating film into the doped silicon film.

42. The method for forming a thin film transistor according to claim 40, (a+c) being 5 or more and 20 or less in the silicon compound represented by a general formula of SiaXbYc (wherein X represents a hydrogen atom and/or a halogen atom, Y represents a boron atom or a phosphorous atom, a and c denote integers of 3 or more, and b denotes an integer of a or more and (2a+c+2) or less).

* * * * *